US006833323B2

(12) United States Patent
Yui et al.

(10) Patent No.: US 6,833,323 B2
(45) Date of Patent: Dec. 21, 2004

(54) METHOD FOR FORMING PATTERNED FEATURES AT A SEMICONDUCTOR WAFER PERIPHERY TO PREVENT METAL PEELING

(75) Inventors: Chen-Hua Yui, Hsin-Chu (TW); Tsu Shih, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/354,710

(22) Filed: Jan. 29, 2003

(65) Prior Publication Data

US 2004/0147128 A1 Jul. 29, 2004

(51) Int. Cl.⁷ ..................... H01L 21/302; H01L 21/461
(52) U.S. Cl. ..................... 438/691; 438/633; 438/628; 257/762; 257/758; 257/773; 257/775
(58) Field of Search ................... 438/691, 633, 438/628, 631, 645, 654, 687; 257/762, 758, 773, 775

(56) References Cited

U.S. PATENT DOCUMENTS

| | | | | |
|---|---|---|---|---|
| 5,117,280 A | * | 5/1992 | Adachi | 257/669 |
| 5,268,193 A | * | 12/1993 | Beuhler | 427/96 |
| 5,885,856 A | * | 3/1999 | Gilbert et al. | 438/129 |
| 6,028,367 A | * | 2/2000 | Yu | 257/780 |
| 6,093,631 A | * | 7/2000 | Jaso et al. | 438/618 |
| 6,551,856 B1 | * | 4/2003 | Lee | 438/108 |
| 2001/0026906 A1 | * | 10/2001 | Matsubara et al. | 430/311 |
| 2002/0170173 A1 | * | 11/2002 | Mashino | 29/852 |

FOREIGN PATENT DOCUMENTS

| | | | | |
|---|---|---|---|---|
| JP | 2001118845 | * | 4/2001 | H01L/21/3205 |
| TW | 464987 | | 2/2000 | |

OTHER PUBLICATIONS

Wolf, et al. "Silicon processing for the VLSI era, vol. 1", Lattice Press, California, (1986), pp. 541–542.*

* cited by examiner

Primary Examiner—Caridad Everhart
(74) Attorney, Agent, or Firm—Tung & Associates

(57) ABSTRACT

A method for preventing peeling of a metal layer formed over a semiconductor wafer process surface during a chemical mechanical polishing (CMP) process including providing a semiconductor wafer having a process surface comprising a periphery portion and a central portion said central portion including active areas having semiconductor devices features formed therein the process surface including a dielectric insulating layer; forming a plurality of openings in the periphery portion to form closed communication with the dielectric insulating layer the plurality of openings having an aspect ratio of at least 2; blanket depositing a metal layer to cover the process surface including the periphery portion to include filling the plurality of openings to anchor the metal layer; and, performing a CMP process to remove at least a portion of the metal layer from the process surface.

21 Claims, 2 Drawing Sheets

US 6,833,323 B2

METHOD FOR FORMING PATTERNED FEATURES AT A SEMICONDUCTOR WAFER PERIPHERY TO PREVENT METAL PEELING

FIELD OF THE INVENTION

This invention generally relates to methods for forming metal filled semiconductor features and more particularly to a method for forming patterned features at a semiconductor wafer periphery to prevent metal peeling in a subsequent CMP process.

BACKGROUND OF THE INVENTION

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron dimensions, whereas the thickness of the dielectric layers, through the use low-k (low dielectric constant) materials, has remained substantially constant. Consequently, the aspect ratios for the features, i.e., their height divided by width, has increased thereby creating additional challenges in adequately filling the sub-micron features with, for example, copper metal. Many traditional deposition processes such as chemical vapor deposition (CVD) have difficulty filling increasingly high aspect ratio features, for example, where the aspect ratio exceeds 2:1, and particularly where it exceeds 4:1.

As a result of these process limitations, electroplating or electrodeposition, which has previously been limited to the fabrication of patterns on circuit boards, is now emerging as a preferable method for filling metal interconnects structures such as via openings (holes) and trench line openings on semiconductor devices. Typically, electroplating uses negatively charged substrate contacted with an electrolyte including positively charged metal ions of deposition material, for example copper ions, to induce electrolytic deposition of the metal ions onto the charged substrate, for example, a semiconductor wafer. A thin metal layer (seed layer) is first deposited on the semiconductor wafer to include lining etched features to provide an electrical pathway across the surfaces. An electrical current is supplied to the seed layer whereby the semiconductor wafer surface is electroplated with an appropriate metal, for example, aluminum or copper.

One exemplary process for forming a series of interconnected multiple layers, for example, is a dual damascene process. Although there are several different manufacturing methods for manufacturing damascene structures, all such methods employ a series of photolithographic masking and etching steps, typically by a reactive ion etch (RIE). In the typical multilayer semiconductor manufacturing process, for example, a dual damascene process, a series of insulating layers are deposited to include a series of interconnecting metallization structures such as vias and metal line interconnects to electrically interconnect areas within the multilayer device and contact layers to interconnect the various devices on the chip surface. In most devices, pluralities of vias are separated from one another along the semiconductor wafer and selectively interconnect conductive regions between layers of a multi-layer device. Metal interconnect lines typically serve to selectively interconnect conductive regions within a layer of a multi-layer device. Vias and metal interconnect lines are selectively interconnected in order to form the necessary electrical connections. In forming a dual damascene structure, via openings (holes) and trench line openings are etched into the insulating layers and are back-filled with metal. The insulating layers where metal interconnect lines (trench lines) are formed are typically referred to as metallization layers and the insulating layer including interconnecting vias are referred to as inter-metal dielectric (IMD) layers. The IMD layers are preferably a low-k (low dielectric constant) insulating material which reduces signal delay times caused by parasitic capacitance. The process by which via openings (holes) and trench lines are selectively etched into the insulating layers is typically a photolithographic masking process, followed by a reactive ion etch (RIE) process, both of which are commonly known in the art.

In filling the via openings and trench line openings with metal, for example, copper, electroplating is a preferable method to achieve superior step coverage of sub-micron etched features. The method generally includes first depositing a barrier layer over the etched opening surfaces, such as via openings and trench line openings, depositing a metal seed layer, preferably copper, over the barrier layer, and then electroplating a metal, again preferably copper, over the seed layer to fill the etched feature to form, for example, vias and trench lines. Finally, the deposited layers and the dielectric layers are planarized, for example, by chemical mechanical polishing (CMP), to define a conductive interconnect feature.

Metal electroplating in general is a well-known art and can be achieved by a variety of techniques. Common designs of cells for electroplating a metal on semiconductor wafers involve positioning the plating surface of the semiconductor wafer within an electrolyte solution including an anode with the electrolyte impinging perpendicularly on the plating surface. The plating surface forms the cathode of the plating system such that ions in the plating solution deposit on the conductive portion of the plating surface.

One method for providing power to the plating surface uses, for example cathode contacts (e.g., pins, 'fingers', or springs) to contact the plating surface which includes a featureless area including a seed layer of metal. The cathode contacts make contact with the cathode contact area which includes a seed layer blanket deposited as close as possible to the semiconductor wafer periphery to minimize the featureless area on the wafer. In the prior art, the seed layer deposited at the wafer periphery has typically been formed over an uppermost insulating (IMD) layer devoid of etched semiconductor features such as vias and trench lines. A shortcoming in the prior art is that, frequently, a subsequent CMP process following the electroplating process to remove excess metal, for example, copper overlying the IMD layer, causes delamination or peeling of the electroplated copper layers especially at the wafer periphery. The CMP induced peeling is believed to be due to poor adhesion between the copper and the underlying layers including a barrier/adhesion layer formed over the IMD layer.

The problem is exacerbated by the use of low-k (low dielectric constant) material used for the IMD layers, for example, having a dielectric constant less than about 3.0. Many of the low-k materials are designed with a high degree of porosity to allow the achievement of lower dielectric constants. A shortcoming of using porous low-k materials is that the low-k IMD layers have poor adhesion to other materials including the copper layers and adhesion/barrier layers, for example, tantalum nitride (TaN) which is frequently deposited over the IMD layer to prevent copper diffusion into the IMD layer. As a result, metal layers, for example, copper, are prone to delamination (peeling), particularly at the process wafer periphery when they are subjected to processing stresses, for example, stresses induced by subsequent metal CMP processes.

There is therefore a need in the semiconductor processing art to develop a method whereby adhesion of metal layers to underlying layers is improved to avoid metal layer delamination or peeling in subsequent metal CMP processes.

It is therefore an object of the invention to provide a method whereby adhesion of metal layers to underlying layers is improved to avoid metal layer delamination or peeling in subsequent metal CMP processes while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for preventing peeling of a metal layer formed over a semiconductor wafer process surface during a chemical mechanical polishing (CMP) process.

In a first embodiment, the method includes providing a semiconductor wafer having a process surface comprising a periphery portion and a central portion said central portion including active areas having semiconductor devices features formed therein the process surface including a dielectric insulating layer; forming a plurality of openings in the periphery portion to form closed communication with the dielectric insulating layer the plurality of openings having an aspect ratio of at least 2; blanket depositing a metal layer to cover the process surface including the periphery portion to include filling the plurality of openings to anchor the metal layer; and, performing a CMP process to remove at least a portion of the metal layer from the process surface.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
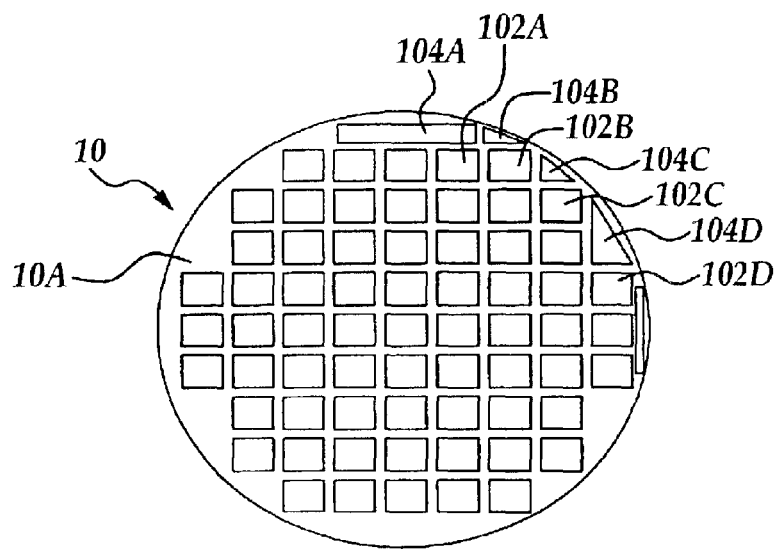
FIG. 1A is a top view of an exemplary process surface of a semiconductor wafer including active die areas and peripheral portions for forming dummy vias in one embodiment of the present invention.

The method of the present invention is explained with reference to the formation of copper filled via features formed by an electrodeposition process. It will be appreciated however that the method of the present invention is applicable in general to providing patterned openings formed in an insulating dielectric layer at a substrate periphery which are subsequently filled with any metal by any deposition process including an overlayer of the metal on a process surface which is subsequently subjected to a chemical mechanical polishing (CMP) process to remove at least a portion of the overlayer of the metal from the process surface. It will be appreciated that although the method of the present invention is explained with respect to the manufacture of an exemplary level of a semiconductor device that the method may be repeated in each level of the multi-level device prior to a metal CMP process. The term 'copper' as used herein refers to copper or alloys thereof.

In a first embodiment of the present invention, a process surface of a semiconductor wafer periphery is provided with anisotropically etched openings including a subsequently deposited metal overlayer to fill the anisotropically etched openings to reduce or avoid peeling of the metal overlayer in a subsequent CMP process to remove at least a portion of the metal overlayer.

For example, the semiconductor wafer process surface includes a plurality of multi-level semiconductor devices, referred to as die, or active areas formed within a central portion of the process surface. In one embodiment, the anisotropically etched openings form a pattern of openings at the process surface periphery. The anisotropically etched openings are preferably provided at the process surface periphery (peripheral portion) where they are photolithographically patterned and anisotropically etched into an insulating dielectric layer, for example, an IMD layer having a low dielectric constant (less than about 3.0). There are several types of materials suitable for forming low dielectric constant (low-k) insulting dielectric layers that are known in the art. Exemplary low-k inorganic materials include carbon or fluorine doped silicon oxide, and spin on glasses SOG), xerogels or porous oxides. Exemplary low-k organic materials include polysilsequioxane, parylene, polyimide, benzocyclobutene and amorphous Teflon.

Preferably the anisotropically etched openings provided in the insulating dielectric layer at the process surface periphery are anisotropically etched through a portion of the insulating dielectric layer to form closed communication with the insulating dielectric layer. For example the anisotropically etched openings are dummy via openings, for example, defined as via features providing no electrically conductive communication with an underlying semiconductor feature. Preferably, the dummy via openings are photolithographically patterned and anisotropically etched in parallel with the formation of other semiconductor structures being formed in active areas of the central portion of the process wafer. The dummy via openings (anisotropically etched openings) at the process surface periphery are formed by conventional photolithographic patterning and anisotropic etching techniques. Preferably, the dummy via openings are subsequently filled with metal by depositing a metal layer by a conventional metal deposition process including physical vapor deposition (PVD), chemical vapor deposition (CVD), electroplating or combinations thereof which are known in the art.

In another embodiment, the anisotropically etched openings at the process surface periphery are formed in a patterned array along the process wafer periphery. By 'patterned array' herein is meant any regularly repeating spacing of anisotropically etched openings forming a pattern, which pattern regularly repeats along at least one direction parallel with the process surface.

Preferably, the patterned array is patterned such that a spacing[s] between the openings at the process surface is from about 1 opening diameter to about 10 opening diameters. Preferably, the anisotropically etched openings have a diameter from about 0.1 microns to about 0.5 microns and are anisotropically etched to have a depth of from about 1000 Angstroms to about 10,000 Angstroms. For example, the anisotropically etched openings at the process surface periphery (dummy vias) may have about the same opening diameter and depth as vias provided in the active areas of the process wafer to make parallel processing more efficient. Preferably, the anisotropically etched openings (dummy via openings) at the process surface periphery have an aspect ratio of at least 2 where the aspect ratio is defined as the opening depth divided by the opening diameter. More preferably, the dummy vias have an aspect ratio of between about 3 and about 5.

Referring to FIG. 1A, is shown an exemplary semiconductor wafer 10 having a process surface 10A, and having an array of active device areas e.g., 102A, 102B, 102C, 102D, formed in a central portion of the process surface. Peripheral portions (periphery) of the process surface e.g., 104A, 104B, 104C, 104D, include areas, for example, where there active device areas (die) are not formed due to, for example, insufficient available area at the periphery. According to one embodiment of the present invention, a patterned array of anisotropically etched openings (dummy via openings) are provided in the peripheral portions e.g., 104A, 104B, 104C, 104D, to improve an overlying metal layer adhesion. Preferably, the dummy via openings are provided along at least a portion of the periphery preferably, along the entire peripheral circumference of the process surface not covered by active areas. For example, a special reticle (photomask) for photolithographic patterning the dummy vias may be used in a separate photolithographic patterning process or mounted in the reticle frame of a normal photomask to accomplish photolithographic patterning of the dummy via openings at the process surface periphery in parallel with normal semiconductor feature patterning.

Figure 2A:
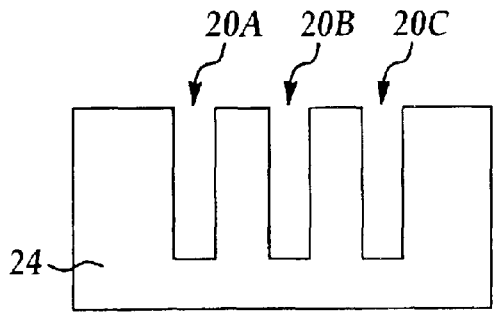
FIGS. 2A–2E are cross sectional side views of portions of the semiconductor process surface showing an exemplary level of dummy vias at stages of manufacture according to an embodiment of the present invention.

In an exemplary embodiment, the vias are filled with copper by a conventional electroplating process. For example, referring to FIG. 2A, is shown a cross-sectional representation of a portion of the process wafer at one level of a multi-level semiconductor device including exemplary dummy via structures. In an exemplary process dummy via openings e.g., 20A, 20B, 20C are formed in an intermetal dielectric (IMD) layer 24 at a peripheral portion of the process wafer. The IMD layer 24 including the dummy via openings e.g., 20A, 20B, 20C, is for example, formed of a low-k material, for example, carbon doped silicon dioxide, with a dielectric constant of less than about 3.0. The IMD layer 24 is typically formed by conventional CVD processes including PECVD and HDP-CVD with the IMD layer 24 typically about 3000 to about 10,000 Angstroms in thickness. Deposited over the (IMD) layer 24, there is typically formed an etch stop layer (not shown), preferably silicon nitride (SiN), and a dielectric anti-reflective coating (DARC) layer (not shown), preferably silicon oxynitride (e.g., SiON), for reducing undesirable light reflections in the photoresist masking process to define the semiconductor features including dummy via openings.

The dummy via openings e.g., 20A, 20B, 20C are preferably formed by a photolithographic patterning step including a separately formed photomask for patterning the dummy via openings either separately or in parallel with photolithographic patterning of other semiconductor features in active areas. For example, the photomask including the dummy via pattern may be mounted in the frame area of the reticle used for patterning the active areas. Alternatively, a separate patterning step may be carried out using a dummy via pattern photomask. Following photolithographic patterning, a conventional anisotropic reactive ion etch (RIE) (plasma etching) step is performed where the dummy via openings are preferably etched in parallel with other patterned semiconductor features patterned in active areas.

Figure 2B:
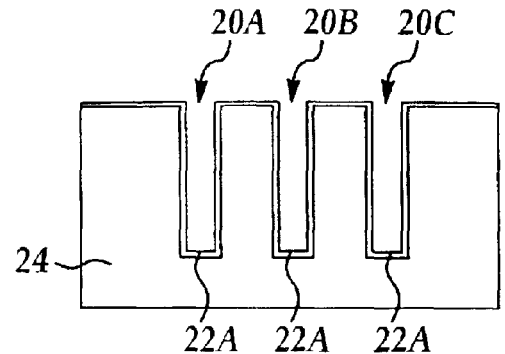

Referring to FIG. 2B, prior to filling the dummy via openings e.g., 20A, 20B, 20C, with, for example, copper, typically a barrier/adhesion layer 22A of, for example, tantalum nitride (TaN) is conformally deposited over the dummy via openings e.g., 20A, 20B, 20C to include lining the via walls and via floor. The barrier/adhesion layer 22A is optionally formed to prevent diffusion of the fill metal, for example, copper, into the insulating IMD layer 24. The barrier/adhesion layer 22A is formed by a conventional CVD process known in the art for depositing, for example, tantalum nitride. The barrier/adhesion layer 22A preferably has a thickness between about 25 Angstroms and about 400 Angstroms.

Figure 2C:
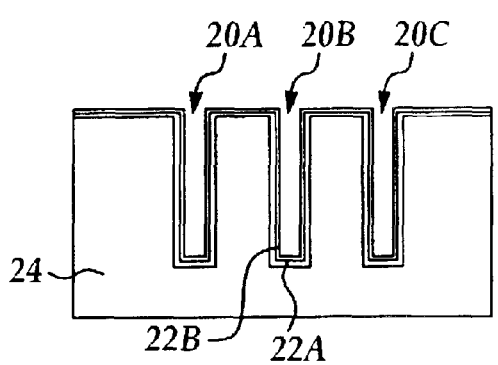

Referring to FIG. 2C, prior to performing an electroplating process to fill the semiconductor feature openings including the dummy via openings e.g., 20A, 20B, 20C, with a metal, for example copper, a copper seed layer 22B is deposited over the barrier/adhesion layer 22A. Other metals, particularly noble metals, can also be used for the seed layer, preferably, however, the seed layer is the same metal used to fill the dummy via openings in the subsequent electroplating process, for example, copper. The copper seed layer 22B provides improved adhesion for subsequently electrodeposited metal layers, as well as a conformal conductive layer for electrodeposition of an overlying metal layer. The copper seed layer 22B is preferably deposited over the peripheral portions of the process wafer including the dummy via openings e.g., 20A, 20B, 20C, in parallel with electrodeposition over the active areas of the process wafer including other semiconductor features, for example, via openings and trench openings formed in active areas. The copper seed layer 22B may be formed by a conventional CVD or physical vapor deposition (PVD) process. The thickness of the copper seed layer 22B typically varies between about 300 angstroms and 1000 angstroms.

Figure 2D:
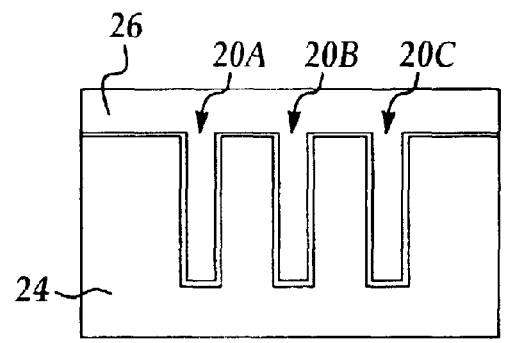
Figure 2E:
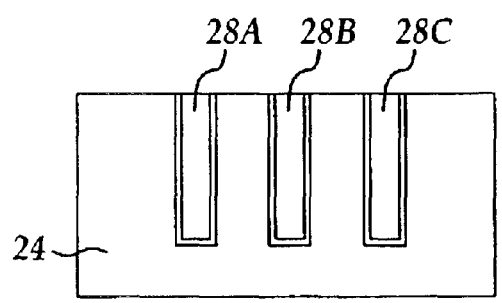

Referring to FIG. 2D, a copper layer 26, for example, is electroplated by conventional electrodeposition methods over the copper seed layer (not shown) to completely fill the dummy via openings e.g., 20A, 20B, 20C, including a copper layer overlying the IMD layer 24 and barrier/adhesion layer 22A. Referring to FIG. 2E, following the electroplating process, the copper layer 26 is then planarized, preferably by a conventional chemical mechanical polishing (CMP) process to remove excess copper overlying the IMD layer 24 and to define metal filled features. During the CMP process, portions of the copper layer 26, copper seed layer 22B, and barrier layer 22A are removed from the upper process surface leaving a globally planar process surface including copper filled dummy vias e.g., 28A, 28B, 28C.

Figure 1B:
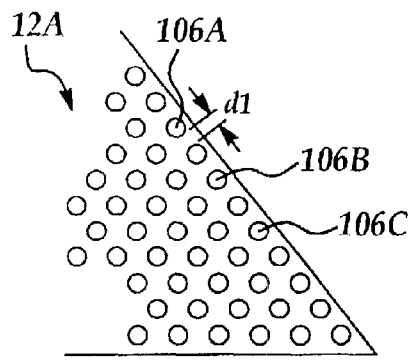
FIGS. 1B and 1C are expanded top view portions of peripheral portions of the wafer process surface having dummy vias formed according to embodiments of the present invention.

Referring to FIG. 1B, is shown an expanded view of a triangular shaped peripheral portion 12A of the process wafer. It will be appreciated that the peripheral portion of the process wafer for forming the patterned dummy vias may be include any shaped peripheral portion including rectangular depending on the area of the peripheral portion remaining unused by the active areas. Frequently the peripheral portion will be a triangularly shaped pattern. Preferably, the patterned dummy vias are formed in the peripheral portions of the process wafer not covered by other features, for example, including active die areas, or alignment mark areas. Preferably, the patterned dummy via openings are formed along at least a portion of the periphery of the process surface, preferably including along the entire peripheral circumference. For example the patterned dummy vias may include areas of about 1 mm to about 3 mm at the process wafer periphery.

Figure 1C:
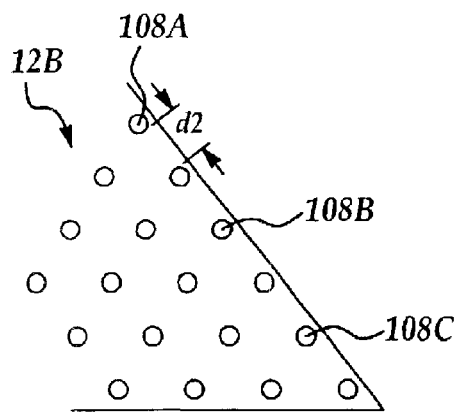

Still Referring to FIG. 1B, an exemplary portion of dummy via openings e.g., 106A, 106B, 106C, are shown formed with a spacing distance e.g., d1 between dummy via openings about equal to a dummy via opening diameter. Preferably, the dummy via openings are formed having a spacing distance d between dummy via openings from about 1 to about 10 dummy via opening diameters. For example, referring to FIG. 1C is shown an exemplary peripheral portion 12B having exemplary dummy via openings e.g., 108A, 108B, 108C, shown formed with a spacing distance e.g., d2 between dummy via openings between about 2 and 3 dummy via opening diameters. It will be appreciated that the surface density of dummy via openings may be varied (i.e., variable spacing distance between dummy via openings) depending on a dummy via opening diameter and aspect ratio and desired adhesion strength with the underlying layer. For example, with a conventional via diameter for the dummy vias of from about 0.1 microns to about 0.25 microns, a higher density of dummy via openings (a smaller spacing distance between dummy via openings) with lower aspect ratios will increase and adhesion strength of the overlying metal to the underlying layer. For example, it is believed that the metal filled dummy vias act to anchor the overlying metal layer to the IMD layer and prevent peeling of the metal layer in a subsequent metal CMP process to remove at least a portion of the metal layer, during which process, stresses perpendicular to the metal layer are generated. In addition, the desired surface density of dummy vias may be increased with an increasing thickness of the overlying metal layer or decreasing aspect ratio of the dummy via opening. For example, it has been found that for via diameters of from about 0.1 microns to about 0.5 microns with aspect ratios of from about 2 to about 5, that a spacing distance between dummy vias of from about 1 via opening diameter to about 10 via opening diameters will prevent peeling or delamination of an overlying metal layer during a CMP process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for preventing peeling of a metal layer formed over a semiconductor wafer process surface during a chemical mechanical polishing (CMP) process comprising the steps of:

providing a semiconductor wafer having a process surface comprising a periphery portion and a central portion said central portion comprising active areas having semiconductor device features formed therein the process surface including a dielectric insulating layer;

forming a plurality of dummy via openings having a diameter in the periphery portion through a thickness portion of the dielectric insulating layer in closed communication with the dielectric insulating layer;

blanket depositing a metal layer to cover the process surface including the periphery portion to include filling the plurality of dummy via openings to form a plurality of dummy vias to anchor the metal layer; and, performing a CMP process to remove at least a portion of the metal layer from the process surface.

2. The method of claim 1, wherein the plurality of dummy via openings are formed having an aspect ratio of at least about 2.

3. The method of claim 2, wherein the dielectric insulating layer has a dielectric constant of less than about 3.0.

4. The method of claim 3, further comprising the step of blanket depositing a barrier/adhesion layer to cover the dielectric insulating layer including the plurality of dummy via openings prior to the step of blanket depositing the metal layer.

5. The method of claim 1, wherein the step of blanket depositing the metal layer comprises an electrodeposition process where a seed layer is deposited over the barrier/adhesion layer prior to the electrodeposition process.

6. The method of claim 1, wherein the metal layer comprises copper.

7. The method of claim 1, wherein the plurality of dummy via openings comprises a patterned array with a spacing distance between each of the plurality of openings of from about 1 opening diameter to about 10 opening diameters.

8. The method of claim 7, wherein the patterned array is formed with a uniform spacing distance between each of the plurality of dummy via openings.

9. The method of claim 1, wherein the plurality of dummy via openings formed in the periphery portion is formed along the entire circumference of the process surface.

10. The method of claim 1, wherein the plurality of dummy via openings have an opening diameter of from about 0.1 microns to about 0.5 microns and an aspect ratio of from about 1:2 to about 1:5.

11. The method of claim 1, wherein the step of forming a plurality of dummy via openings comprises transferring an image of a patterned array onto the process surface according to a photolithographic process.

12. The method of claim 1, wherein the dielectric insulating layer comprises a material selected from the group consisting of carbon doped silicon oxides, fluorine doped silicon oxide, spin on glasses SOG), porous oxides, polysilsesquioxane, parylene, polyimide, benzocyclobutene, and amorphous Teflon™.

13. A wafer dummy via pattern for preventing peeling of a copper layer formed over a semiconductor wafer process surface during a chemical mechanical polishing (CMP) process comprising:

a semiconductor wafer having a process surface comprising a periphery portion and a central portion said central portion including active areas for forming semiconductor devices features said periphery portion devoid of semiconductor devices said process surface including a dielectric insulating layer; and, a plurality of dummy vias penetrating a portion of the dielectric insulating layer thickness at the periphery portion forming closed communication with the dielectric insulating layer.

14. The wafer dummy via pattern of claim 13, wherein the plurality of dummy vias each have an aspect ratio of at least about 2.

15. The wafer dummy via pattern of claim 13, wherein the dielectric insulating layer has a dielectric constant of less than about 3.0.

16. The wafer dummy via pattern of claim 13, wherein the plurality of dummy vias each further include a barrier/adhesion layer adjacent the dielectric layer.

17. The wafer dummy via pattern of claim 13, wherein the plurality of dummy vias comprise a patterned array having a spacing distance between each of the plurality of dummy vias of from about 1 via opening diameter to about 10 via opening diameters.

18. The wafer dummy via pattern 17, wherein the patterned array includes at least a patterned array portion wherein the spacing distance between each of the plurality of dummy vias is about the same.

19. The wafer dummy via pattern of claim 17 wherein the plurality dummy vias comprise via opening diameters of from about 0.1 microns to about 0.5 microns having an aspect ratio of from about 1:2 to about 1:5.

20. The wafer dummy via pattern of claim 13, wherein the plurality of vias comprise copper.

21. The wafer dummy via pattern of claim 13, wherein the dielectric insulating layer comprises a material selected from the group consisting of carbon doped silicon oxides, fluorine doped silicon oxide, spin on glasses SOG), porous oxides, polysilsesquioxane, parylene, polyimide, benzocyclobutene, and amorphous Teflon™.

* * * * *